United States Patent [19]

Bacher et al.

[11] Patent Number: 5,795,519
[45] Date of Patent: Aug. 18, 1998

[54] PROCESS OF MAKING A MICROSTRUCTURED PLASTIC MOLD

[75] Inventors: Walter Bacher, Stutensee; Peter Bley, Eggenstein-L.; Michael Harmening, Hirschberg, all of Germany

[73] Assignee: Kernforschungszentrum Karlsruhe GmbH, Karlsruhe, Germany

[21] Appl. No.: 358,397

[22] Filed: Dec. 19, 1994

Related U.S. Application Data

[63] Continuation-in-part of PCT/DE93/00426 May 17, 1993.

[30] Foreign Application Priority Data

Jun. 16, 1992 [DE] Germany .......................... 42 19 667.1

[51] Int. Cl.$^6$ .................................................. B29C 59/02
[52] U.S. Cl. ...................... 264/139; 264/219; 264/293; 264/322
[58] Field of Search ..................... 264/139, 219, 264/293, 322

[56] References Cited

U.S. PATENT DOCUMENTS 5,073,237  12/1991  Bacher et al. .......................... 264/320

FOREIGN PATENT DOCUMENTS

| 0148377 | 7/1985  | European Pat. Off. . |
| 3035271 | 3/1981  | Germany . |
| 3537483 | 12/1986 | Germany . |
| 4010669 | 4/1991  | Germany . |
| 2160472 | 12/1985 | United Kingdom . |

*Primary Examiner*—Leo B. Tentoni
*Attorney, Agent, or Firm*—Klaus J. Bach

[57] ABSTRACT

In a process of making a microstructured plastic mold from which structures can be formed galvanically a compound layer including an electrically conductive and an insulating layer portion is provided and is heated, and impressed into the insulating layer portion is a tool which has microstructured bodies disposed thereon of a height corresponding at least to the thickness of the insulating layer portion and with rough front surfaces having points and ridges adapted to penetrate the electrically insulating layer thereby to expose the electrically insulating layer at the bottom of the cavities formed by microstructured bodies.

1 Claim, 1 Drawing Sheet

PROCESS OF MAKING A MICROSTRUCTURED PLASTIC MOLD

This is a continuation-in-part application of International application PCT/DE93/00426 dated May 17, 1993 claiming the priority of German application P 42 19 667.1 of Jun. 16, 1992.

BACKGROUND OF THE INVENTION

The present invention relates to a process for producing a microstructured plastic layer including a compound structure consisting of an electrically conductive and an electrically insulating portion and having microprojections of a height corresponding at least to the thickness of the electrically insulating layer portion and to a tool for producing such microstructured plastic layer.

Such a process and such a tool are disclosed in DE 35 37 483 C1. FIGS. 2 and 13 show a tool consisting of a base plate with microstructures disposed thereon wherein the front faces of the microstructures extend parallel to the base plate.

This publication also discloses a process for the manufacture of a multitude of plate-like microstructured bodies of metal by which negative forms of the microstructures are produced by multiple forming with an electrically insulating forming material by means of a tool exhibiting the microstructures. Herein the microstructures are galvanically covered with a metal whereupon the negative forms so obtained are removed. In one embodiment (step b) the electrically insulating forming material is combined with a layer of electrically conductive forming material, wherein the thickness of the electrically insulating forming material corresponds to the height of the microstructures in such a way that the electrically conductive forming material contacts the front surfaces of the microstructures of the tool during the forming procedure.

In this process the tool carrying the microstructures is to be pressed through the electrically insulating layer of the compound layer to such an extent that the front face portions of the microstructures reach the electrically conductive layer. For this procedure the compound layer is heated. The thickness of the electrically insulating layer is indicated to be 0.3 mm. During impressing of the tool the front face portions of the microstructures are to expose the electrically conductive layer such that the electrically conductive layer can become an electrode and the cavities formed by the microstructures of the tool can be filled galvanically with a metal.

For the electrically conductive layer of the compound layer a forming material consisting of PLEXIGLASS® (polymethylmethacrylate, PMMA) and 20 wt. % conductive carbon is proposed, the electrically insulating layer consists of pure PLEXIGLASS®.

It has been found that, with this process, the electrically conductive layer is not or nowhere fully exposed especially if the front faces of the microstructures on the tool are relatively large whereby the insulating layer remains such that the electrodes for the galvanic deposition of the metal are not or not properly formed. The flat front faces of the tool cannot properly penetrate the insulating layer without leaving an insulating film. This is also true if the insulating layer has a thickness of less than one tenth of the height of the microstructures and the microstructures of the tool are fully impressed into the compound layer. Even then an electrically insulating rest remains on the base of the cavities in the compound layer formed by the tool. The process is limited, therefore, to the forming with tools whose microstructures have very small front surface areas.

A further method of making negative forms for the galvanic forming of microstructured plate-like bodies is disclosed in U.S. Pat. No. 5,073,237. In this method also a compound layer is provided which consists of an electrically conductive and an insulating layer portion. The master mold is impressed, also at elevated temperature—but in contrast to the earlier-described method—through the film of electrically conductive material into the non-conductive layer. In this method the film of conductive material is said to be 50 to 500 µm. Before the film of conductive material is deposited the non-conductive plastic layer is to be roughened by micro sand blasting. Upon impression of the tool into the compound layer, in this method the film of electrically conductive material ruptures at the locations of the tool where the microstructures are present. After removal of the tool, small discrete spangles of the conductive material remain on the vertical walls and on the front faces of the formed microstructures. In the structure bases however the film of electrically conductive material remains fully intact.

However, this method can be used only if the structure base of the formed recesses in the compound layer is a contiguous surface since only then an electrically conductive layer is formed which can be connected as an electrode.

It is the object of the present invention to provide a process for producing microstructured plastic layers from which structurally accurate copies can be reliably formed even if the tool used for the forming step has microstructures with relatively large front face areas. It should be possible to form the microstructured plastic layer made in this manner—independently of the form and geometric arrangement of the microstructures—always by a galvanic process wherein the electrically conductive layer of the compound layer is connected so as to serve as an electrode. Also a tool for performing the process according to the invention is to be provided.

SUMMARY OF THE INVENTION

In a process of making a microstructured plastic mold from which structures can be formed galvanically a compound layer comprising an electrically conductive and an insulating layer portion is provided and is heated and impressed into the insulating layer portion is a tool which has microstructured bodies disposed thereon of a height corresponding at least to the thickness of the insulating layer portion and with rough front surfaces having points and ridges adapted to penetrate the electrically insulating layer thereby to expose the electrically insulating layer at the bottom of the cavities formed by microstructured bodies.

The process according to the invention utilizes a compound layer consisting of a layer of electrically conductive material and a layer of electrically non-conductive, that is, insulating, materials As electrically conductive material conductive carbon containing polymethylmethacrylate as proposed in DE 35 37 483 C1 referred to earlier may be used. But PMMA with metal powder fillers may also be used. The electrically conductive material may be formed, for example, by melting a mixture of 10 to 20 wt. % nickel and/or silver powder and the corresponding amount of PMMA powder. Further, electrically conductive plastic such as polyacetylene doped with metal ions or polythiophene can be used as electrically conductive material. Finally, fullerenes with enclosed metal ions appear to be suitable as conductive material. It is merely important that, at elevated temperatures, the electrically conductive material becomes soft enough so that a microstructured tool can be formed out accurately and that, at lower temperatures during the galvanic forming procedure, it is mechanically sufficiently stable.

As electrically non-conductive material PMMA or another polymer or copolymer which is deformable at elevated temperatures is suitable.

The compound layer can be made in the manner as described in DE 35 37 483 C1 referred to earlier, for example, by pouring the electrically conductive material onto a removable support structure where it is permitted to solidify and then applying the non-conductive layer onto the conductive layer in the same manner. Another possibility would be to combine a first layer of an electrically conductive material at an elevated temperature with a second layer of an electrically non-conductive material.

The layer of electrically conductive material must be at least sufficiently thick so that the microstructures of the tool will not penetrate this layer during the forming step. The upper limit for the thickness of this layer is merely a matter of economical considerations and may also depend on requirements for handling during the forming and subsequent galvanizing procedure. The optimum layer thickness depends on the material utilized. If a PMMA filled with carbon or metal ions is used the thickness of the electrically conductive layer is about 5 µm to 10 mm. Preferably, it is in the range of 30 µm to 3 mm.

The thickness of the electrically non-conductive layer depends on the roughness of the front faces of the microstructured bodies on the tool in use. The thickness of the insulating layer must be selected such that a large number of the points and ridges on the rough surfaces of the microstructured bodies penetrates the insulating layer. The insulating layer should therefore have a thickness of at least 0.5 µm but less than 20 µm. With a corresponding roughness of the front faces of the microstructured bodies, an insulating layer with a thickness of 0.5 µm to 1 µm is preferred.

Subsequently the compound layer described is heated to such a temperature that the tool can be impressed into it. If the compound layer consists mainly of PMMA the forming step is performed at a temperature above the softening point, for example, at a temperature of between 110° C. and 160° C. At substantially lower temperatures the compound layer is too brittle such that cracks could develop during the forming step. At substantially higher temperatures the compound layer is too soft so that it could become distorted. If the compound layer consists of other materials, lower or higher temperatures may be better suited.

Into the electrically insulating layer of the heated compound layer a tool of the type described earlier is then impressed wherein this tool has at its front face microstructured bodies of such a roughness that the points and ridges thereon penetrate the electrically insulating material layer. In the area of the front faces the roughness depths $R_t$ should be between 0.1 µm and 10 µm. Tools with a roughness depth $R_t$ of 1 to 5 µm and a medium roughness $R_a$ of 0.1 to 0.5 µm are quite suitable. The medium roughness should be between 0.1 µm and 1 µm. As mentioned earlier the roughness of the front faces should be adjusted to the thickness of the insulating layer.

In the process according to the invention the height of the microstructure bodies on the tool must be greater than the thickness of the insulating layer. For most purposes tools with microstructures of a height of between 50 µm and 700 µm are used.

Tools which are suitable for the process according to the invention can be made from nickel by the well-known LIGA process (X-ray depth lithography galvanic forming), wherein, other than in the usual process, the galvanic forming procedure is continued, after the plastic microstructures are filled, until a 5 mm thick nickel plate free of tensions has been formed which then receives final treatment by mechanical means. To provide for roughness the final treatment may include a micro sand blasting step.

It is important that the front face of the microstructure on the tool has a predetermined roughness. The same roughness may be present on the base of the tool adjacent the microstructured bodies. Such a rough surface has no adverse effects to the method according to the invention; on the contrary, complete galvanization of the microstructured compound layer is facilitated because then, the electrically conductive layer is exposed by the points and ridges of the roughness not only in structure base of the compound layer but also on the top surface. However, if only the cavities formed by the tool are to be filled galvanically, a tool must be used which is rough only at front faces of the microstructured bodies so that the insulating layer on the surface of the compound layer remains intact.

The height of the microstructure bodies on the tool does not need to be uniform; in accordance with the invention the tools may also have microstructures of different heights. The microstructured bodies may have surfaces with one or several steps.

DETAILED DESCRIPTION OF PREFERRED EMBODIMENTS

Figure 1A:
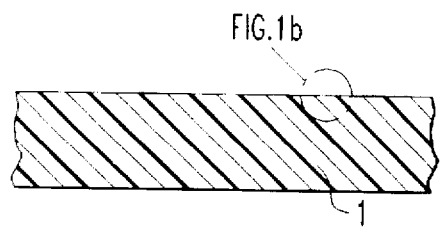
FIGS. 1a and 1b show the compound layer with an enlarged area given in a circle.
Figure 1B:
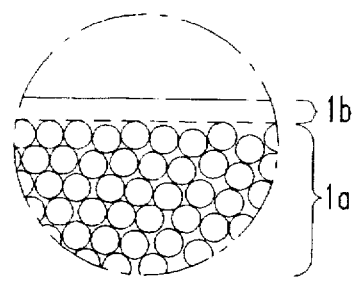

FIG. 1a shows a cross-sectional area of a compound layer 1. In the enlarged cross-sectional area given in FIG. 1b the electrically conductive layer is indicated by the reference numeral 1a. It consists of a polymer which has electrically conductive particles incorporated therein and is covered by a thin electrically insulating layer 1b.

Figure 2A:
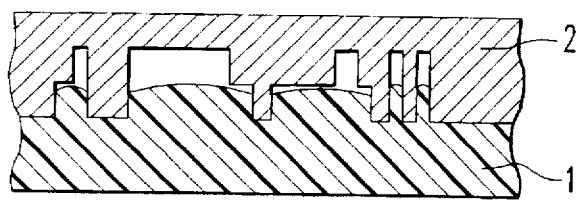
FIGS. 2a and 2b show forming steps.
Figure 2B:
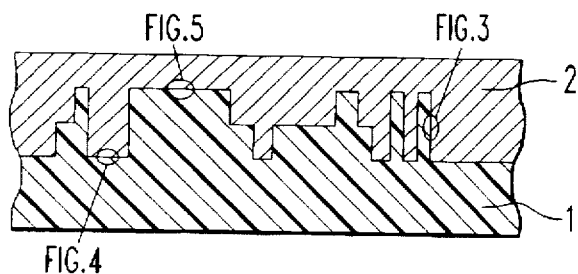

FIGS. 2a and 2b show the forming procedure. A microstructured tool 2 is impressed into the compound layer after the compound layer has been heated, whereby the cavities at the face of the microstructured bodies of the tool are filled with the heated viscous compound layer.

Figure 3:
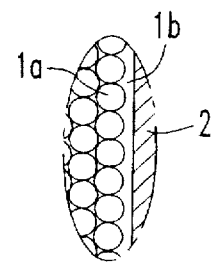
FIGS. 3, 4 and 5 show enlarged sections of FIG. 2b.

From FIG. 3 it can be seen that the vertical walls of the microstructure formed from the compound layer are covered by an insulating material layer 1b.

Figure 4:
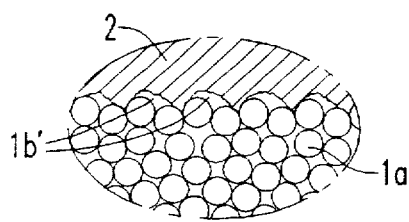

In FIG. 4 it is shown how the rough front faces of the tool penetrate-the already stretched insulating layer from which only rests 1b' remain.

Figure 5:
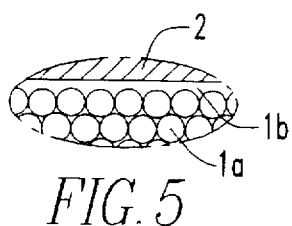

In FIG. 5 it is indicated that the smooth structure base areas of the tool 2 leave the insulating layer on top of the compound layer undisturbed.

Figure 6:
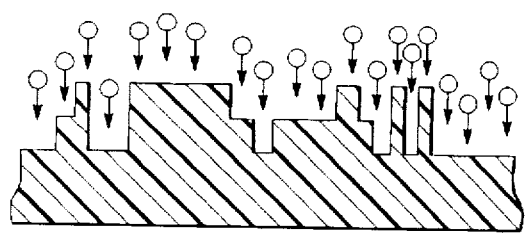
FIG. 6 shows schematically the galvanizing step.

In FIG. 6 the subsequent galvanizing step is shown schematically. During the galvanizing procedure the galvanically deposited metal slowly fills the cavities in the compound layer and finally covers also the top side of the compound layer.

The process according to the invention has a number of advantages.

Since with the process according to the invention microstructured plastic material layers which can be galvanized can be manufactured and which have only the vertical walls of the structures formed thereon covered with the insulating material it is possible to galvanize also over large areas of stepped microstructures.

A further advantage of the process according to the invention is that the thin insulating layer of only a few μm on the surface of the electrically conductive layer can be formed directly with the manufacture of the electrically conductive layer, for example, by permitting sedimentation of the electrically conductive particles. In this manner the manufacture of the compound layer is quite simple and inexpensive. Because of the relatively low process temperatures and pressures small and inexpensive manufacturing equipment can be used with which a plastic material layer which can be galvanized to accurate shapes and without cavities can be provided. The process according to the invention is illustrated below on the basis of some examples.

EXAMPLE 1

Making the Tool

The tool was made starting with a copper base plate which was treated by micro sand blasting. The plate was then covered with a layer of PMMA which was structured by the well-known X-ray lithographic procedures, that is, portions thereof were removed. Subsequently the tool was prepared therefrom by galvanic nickel deposition. The front face areas of the microstructure bodies on the nickel tool had a roughness of $R_a=1.35$ μm and $R_t=7.2$ μm.

The microstructured area of the tool included an area of 500 mm² consisting of 74400 honeycomb-shaped cell structures. The inner diameters of the honeycomb cells was 80 μm, the web width of the side walls was 8 μm and the height of the microstructure bodies was about 180 μm.

EXAMPLE 2

Forming the Tool Make According to Example 1 into a Compound Layer

First the compound layer is prepared from a casting resin filled with silver particles.

For this the following compounds were used:

30 g polymethylmethacrylate (not cross-linked)

70 g methylmethacrylate 4 g separation compound PAT665 (available from Wurtz, Bingen)

2 g dibenzyl peroxide 2 g N,N dimethyl aniline 285 g silver powder (type G321–8000 available from Demetron)

The compounds were mixed at room temperature, poured into a frame with a bottom and precured at room temperature under pressure (about 2 MPa) and then fully cured at ambient pressure and at 120° C.

In a conventional metal form with aluminum bottom an electrically conductive silver containing PMMA layer was prepared on top of a pure MMA layer which was applied to the aluminum bottom before the silver containing PMMA was poured into the metal form. Upon curing the compound layer so formed had, at the bottom of the metal form, a 0.5 μm to 1 μm thick electrically insulating layer without any filler material. Layers with varying thicknesses can be formed by applying, under centrifugal forces, PMMA solutions with different contents of conductive particles.

Then the tool made according to Example 1 was impressed into the compound layer under vacuum at a temperature of about 115° C. After cooling, the structured compound layer could be removed. The microstructured compound layer can subsequently be filled directly by galvanic metal deposition.

EXAMPLE 3

Making Another Compound Layer

To make the compound layer, first an electrically conductive black carbon-filled thermoplastic material was made in a three-roller press. As conductive carbon 12.5 wt. % Printex XE2 (available from Degussa) was worked into 87.5 wt. % of the PMMA injection molding material Degalan G6 (available from Degussa). Then the thermoplastic material was formed under a heatable laboratory press to a plate with a surface of 100×100 mm² and a thickness of 4 mm. By selecting a suitable temperature program a compound layer could be obtained which had a 0.5 to 1 μm thick electrically insulating face layer. The compound layer was then further treated as described in Example 2.

What is claimed is:

1. A process of making a microstructured plastic mold from which structures can be galvanically formed, comprising the steps of;

a) providing a compound layer comprising an electrically conductive layer and an electrically insulating layer, b) heating said compound layer, c) impressing into the electrically insulating layer of the heated compound layer a tool with a plurality of raised microstructured bodies disposed on a base plate wherein said microstructured bodies have front face areas which extend parallel to said base plate, d) the height of said microstructured bodies corresponding at least to the thickness of said insulating layer, e) and the front face areas of said microstructured bodies having a roughness with a roughness depth $R_t$ of between 0.1 μm and 10 μm and with a medium roughness value $R_a$ of 0.01 μm to 1 μm and the insulating layer having a thickness of 0.1 μm to 20 μm wherein, by the given roughness, the front faces have points and ridges which penetrate the electrically insulating layer upon impression of said tool into said electrically insulating layer, thereby providing fully exposed areas of the electrically conductive layer at the bottom of the cavities formed by the raised microstructured bodies, and f) removing said tool from said compound layer to provide said microstructured plastic mold with areas at the bottom of the cavities formed therein where said electrically conductive layer is fully exposed.

* * * * *